(12) United States Patent
Nunoshita et al.

(10) Patent No.: US 7,041,530 B2
(45) Date of Patent: May 9, 2006

(54) METHOD OF PRODUCTION OF NANO PARTICLE DISPERSED COMPOSITE MATERIAL

(75) Inventors: Masahiro Nunoshita, Hyogo (JP); Ichiro Yamashita, Nara (JP); Shigeo Yoshii, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/864,881

(22) Filed: Jun. 10, 2004

(65) Prior Publication Data
US 2005/0042386 A1    Feb. 24, 2005

(30) Foreign Application Priority Data
Jun. 12, 2003    (JP) .............................. 2003-167554

(51) Int. Cl.
*H01L 51/40*    (2006.01)
(52) U.S. Cl. .................. 438/99; 438/82; 438/86; 438/149; 438/517; 438/518; 438/522; 438/530; 438/660; 438/766; 438/767; 438/768; 438/769; 438/781; 438/782; 438/783; 438/784; 438/798; 438/800; 438/917; 438/918; 438/962
(58) Field of Classification Search .................. 438/99, 438/45–46, 82, 149, 800
See application file for complete search history.

(56) References Cited
U.S. PATENT DOCUMENTS

| 6,121,075 | A | 9/2000 | Yamashita | |
|---|---|---|---|---|
| 6,835,591 | B1 * | 12/2004 | Rueckes et al. | 438/99 |
| 6,918,946 | B1 * | 7/2005 | Korgel et al. | 75/362 |
| 2002/0192968 | A1 | 12/2002 | Yamashita | |
| 2003/0034486 | A1 * | 2/2003 | Korgel | 257/13 |
| 2005/0064185 | A1 * | 3/2005 | Buretea et al. | 428/364 |

OTHER PUBLICATIONS

Shigeru Kohmoto et al.; "Site-Controlled Self-Organization of Individual iNAs Quantum Dots By Scanning Tunneling Probe-Assisted Nanolithography"; *Applied Physics Letters*; c. 1999; vol. 75, No. 22; American Institute of Physics.

Shinji Takeoka et al; "Size-Dependent Photoluminescence From Surface-Oxidized Si Nanocrystals in a Weak Confinement Regime"; *Physical Review B*; c. 2000; vol. 62, No. 24; The American Physical Society.

* cited by examiner

*Primary Examiner*—Lynne A. Gurley
(74) *Attorney, Agent, or Firm*—McDermott Will & Emery LLP

(57) ABSTRACT

A method of the production of a nanoparticle dispersed composite material capable of controlling a particle size and a three dimensional arrangement of the nanoparticles is provided. The method of the production of a nanoparticle dispersed composite material of the present invention includes a step (a) of arranging a plurality of core fine particle-protein complexes having a core fine particle, which comprises an inorganic material, internally included within a protein on the top surface of a substrate, a step (b) of removing the protein, a step (c) of conducting ion implantation from the top surface of the substrate, and a step (d) of forming nanoparticles including the ion implanted by the ion implantation as a raw material, inside of the substrate.

12 Claims, 16 Drawing Sheets

Region of Rr from the core center

Accelerating voltage: 100 kV

Ga+ dose amount: 1 x 10$^{16}$ cm$^{-2}$

Accelerating voltage:
S+: 15 kV
Cd+: 15 kV and 40 kV

Cd+, S+ implantation, dose amount: 1 x 10$^{16}$ cm$^{-2}$

S implantation in Al$_2$O$_3$, 1 × 10$^{16}$ cm$^{-2}$ implantation 15 kV

Cd implantation in Al$_2$O$_3$, 1 × 10$^{16}$ cm$^{-2}$ implantation 40 kV

METHOD OF PRODUCTION OF NANO PARTICLE DISPERSED COMPOSITE MATERIAL

BACKGROUND OF THE INVENTION

1. Field of the Invention

The present invention relates to a method of the production of a nanoparticle dispersed composite material having nanoparticles within a substrate.

2. Description of the Related Art

In recent years, nanoparticle dispersed composite materials having nanoparticles formed on the surface of a substrate or within a base board have drawn great attention in the fields of material science as semiconductor quantum dot materials, metal nanoparticle dispersed composite materials and the like.

The semiconductor quantum dot materials have a structure in which semiconductor quantum dots comprising semiconductor single crystals are formed in a base board comprising other semiconductor single crystals. According to the materials having such a structure, manifestation of various physical properties or functions which can not be expected for conventional three dimensional semiconductors in a bulk state has been predicted.

According to the metal nanoparticle dispersed composite material, dispersed metal nanoparticles exhibit specific electronic properties, and photophysical properties, magnetism, conductive phenomenon of the metal nanoparticle interact mutually, therefore, manifestation of functions of the material having prominent added value has been expected utilizing such various properties. In the future, whether or not desired nanoparticle dispersed composite materials can be produced will be the key of development of the nanoparticle dispersed composite materials.

Methods of the production of a nanoparticle dispersed composite material that have been conventionally known are described below. FIG. 21 is a top perspective view schematically illustrating the first step of the most advanced method of the production of a semiconductor quantum dot material subjected to news release on 29, Jul. 2002 by Fujitsu Research Institute, and also reported in the 26th International congress on semiconductor physics (ICPS2002). First, as is shown in FIG. 21, a voltage is applied on a GaAs base board 51 by bringing a probe 52 of an atomic force microscope (AFM) into contact therewith. Such application of a voltage results in decomposition of the moisture included in the atmosphere into H$^+$ and OH$^-$ by a local electric field formed by the probe 52, and the OH$^-$ leads to oxidation of a part of the base board 51 immediately below the probe 52 in a dot shape. Thus, an oxidized product 53 having the dot shape is formed on the base board 51. The diameter of the oxidized product 53 in the dot shape can be controlled by a time period of the oxidation, i.e., application time period of the voltage.

FIG. 22 is a cross sectional view schematically illustrating steps following FIG. 21 according to the method of the production described above. As is shown in FIG. 22 (a), the oxidized product 53 in the dot shape is removed by etching or the like (St 10), and as is shown in (b), recessions 54 are formed on the surface of the base board 51. Next, self organization of GaAs quantum dots 55 is allowed at only the recessions 54 by growth control that is referred to as Stranski-Krastanov mode (S-K mode) of a molecular beam epitaxy growth method (MBE method), as is shown in (c) (St 11). It is reported that production of semiconductor quantum dots with an arrangement of semiconductor quantum dots having a minimum diameter of 20 nm at intervals of several 10 nm is permitted, according to this method.

Appl. Phys. Lett., 75, (1999) 3488–3490, S. Kohmoto, et al., reported that production of semiconductor quantum dot materials with an arrangement of semiconductor quantum dots having a diameter of 30 nm at intervals of 45 nm is permitted by lithography on a GaAs base board in which a probe of a scanning tunneling microscope (STM) is used, and self organization growth of InAs using an MBE method.

Phys. Rev. B, 62, (2000) 16820–16825, S. Takeoka, et al., reported that semiconductor nanocrystals (Si, Ge, SiGe or the like) having a diameter of 2.5 to 9 nm are formed as a guest substance within a solid matrix thin membrane ($SiO_2$, $GeO_2$, $Al_2O_3$ or the like) by a simultaneous radio frequency sputtering method and a thermal treatment.

JP-A No. 11-45990 describes that a quantum device having only metal nanoparticles arranged on a base board is formed by arranging a protein internally including a metal nanoparticle on a base board followed by burning of the protein.

Furthermore, a technique in which formation of nanoparticles is allowed inside of a base board by ion implantation has been known. In such a technique, for example, masking is executed except for an opened region to which subjecting to ion implantation is intended on the surface of the base board, and an accelerated ion is implanted on the surface of the base board. For the formation of masking, a technique of photolithography is generally employed.

According to the method of the production in FIG. 21 and FIG. 22, the diameter of thus resulting semiconductor quantum dot is 20 nm at the minimum. According to the process for the production of dots, particle size, pitch and the like of the semiconductor quantum dot are dependent on precise control of the probe, therefore, it is difficult to obtain semiconductor quantum dots having a particle size of 10 nm or less, or to obtain semiconductor quantum dots arranged at pitches of 10 nm or less. In addition, possible manufacture was limited only to a 100 nm square, therefore, there existed a restriction of extremely low throughput. Further, because the dot shape according to the S-K mode growth is in a pyramid type or a dome type having a shorter height in comparison with the length of the bottom, a problem was raised of the aspect ratio being provided at most approximately fifth.

According to the method described in Appl. Phys. Lett., S. Kohmoto, et al., supra, there exists a limitation for the formation of a nanostructure, and it was impossible to obtain a semiconductor quantum dot material with semiconductor quantum dots having a diameter of, for example, 10 nm or less, which are arranged at intervals of, for example, 10 nm or less.

According to the method described in Phys. Rev., S. Takeoka, et al., supra, although the particle size of nanoparticles was reported as being 9.0 nm±1.8 nm, it was difficult to control and manufacture the particle size and arrangement essentially as the design of the device by the control of the concentration, temperature of the thermal treatment and time in such a method.

According to the method described in JP-A No. 11-459901, production of the nanoparticle dispersed composite material having nanoparticles within a base board was difficult.

Further, in the method according to the ion implantation, formation of the mask is generally conducted by photolithography, however, there exists limitation for the formation of the nanostructures. Thus, it was impossible to obtain semiconductor quantum dots with nanoparticles having a diameter of, for example, 10 nm or less, which are arranged at intervals of, for example, 10 nm or less.

SUMMARY OF THE INVENTION

The present invention was accomplished taking into account of the problems as described above, and an object thereof is to provide a method of the production of a nanoparticle dispersed composite material capable of controlling a particle size and a three dimensional arrangement of nanoparticles in the nanoparticle dispersed composite material. In particular, an object of the invention is to provide a method of the production of a nanoparticle dispersed composite material which allows for the production even if the particle size of the nanoparticle is 10 nm or less, and the intervals among respective nanoparticles is 10 nm or less.

The method of the production of the nanoparticle dispersed composite material according to the present invention comprises a step (a) of arranging a plurality of core fine particle-protein complexes having a core fine particle, which comprises an inorganic material, internally included within a protein on the top surface of a substrate, a step (b) of removing the protein, a step (c) of conducting ion implantation from the top surface of the substrate, and a step (d) of forming nanoparticles including the ion implanted by the ion implantation as a raw material, inside of the substrate by a thermal treatment.

In the aforementioned step (b), the protein is preferably removed by a thermal treatment.

As the aforementioned protein, apoferritin may be used. Further, the aforementioned complex in which a core fine particle comprising iron is internally included within apoferritin can be used.

The aforementioned nanoparticle may be preferably any one of a semiconductor, a compound semiconductor, or a metal.

The aforementioned nanoparticle may be preferably any one of GaAs, CdS, or Cu.

In the step (c), the ion implantation is conducted at an accelerating voltage of, preferably 5 kV or greater, and more preferably 10 kV or greater.

In the aforementioned step (c), the mean range in the lateral direction of the implanted ion is preferably equal to or less than the center-to-center dimension of the aforementioned core fine particles, and more preferably equal to or less than ½ of the value.

In the aforementioned step (b), preferably, the core fine particles having an approximately identical value of the diameter within the range of 2 nm or greater and 50 nm or less are regularly arranged with the center-to-center dimension thereof falling within the range of 4 nm or greater and 70 nm or less.

The layer of the aforementioned substrate in which the aforementioned nanoparticles are formed comprises, for example, $SiO_2$ or $Al_2O_3$.

In the aforementioned step (c), a dose amount of the implanted ion is, preferably within the range of $1 \times 10^{15}/cm^2$ or greater and $1 \times 10^{17}/cm^2$ or less.

Foregoing object, other object, features, and advantages of the present invention will be apparent from the following detailed description of the preferred embodiments with reference to the accompanying drawings.

DETAILED DESCRIPTION OF THE INVENTION

Figure 20:
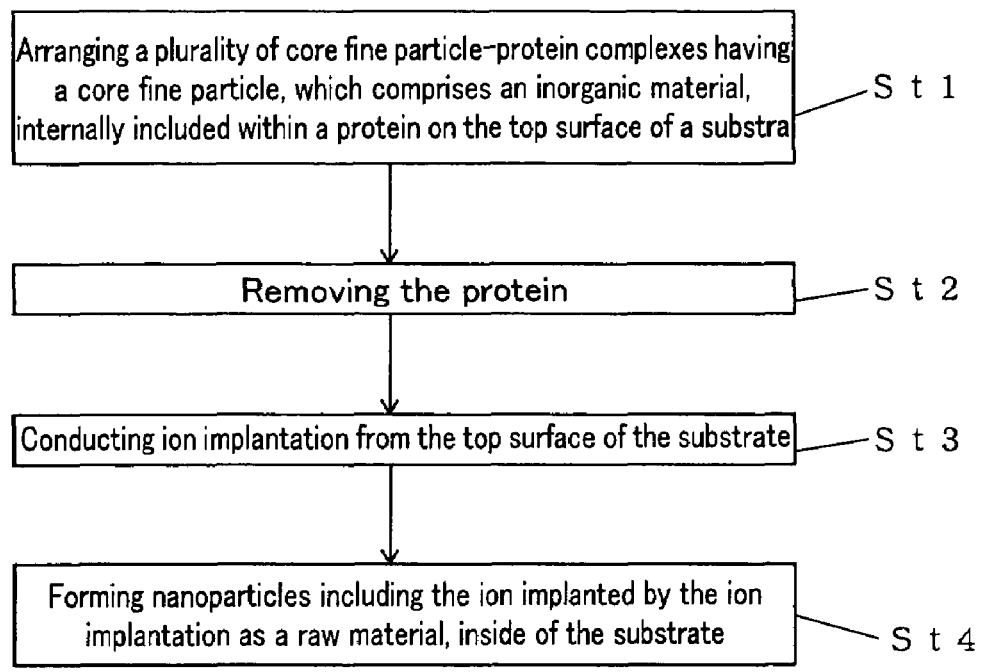
FIG. 20 is a block diagram illustrating the method of the production of a nanoparticle dispersed composite material.
Figure 21:
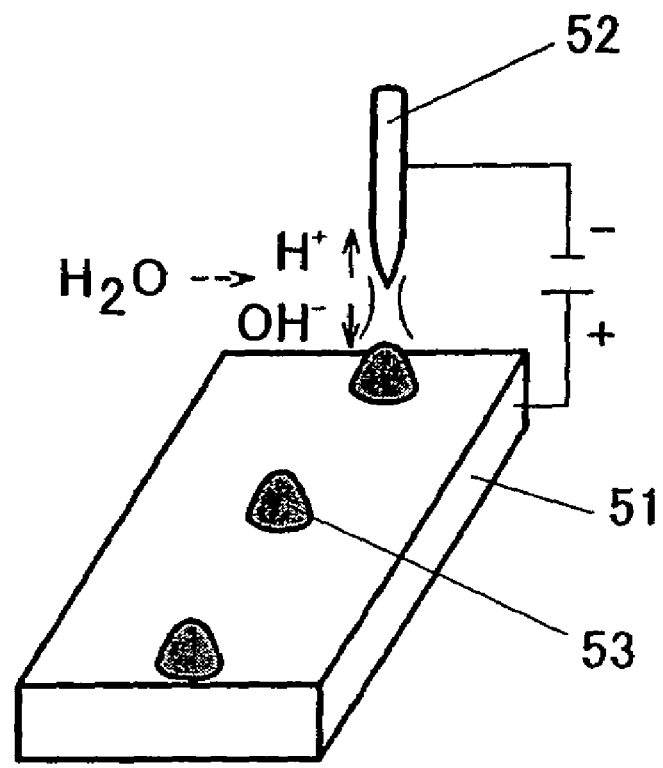
FIG. 21 is a top perspective view schematically illustrating a conventional method of the production of semiconductor quantum dots.
Figure 22:
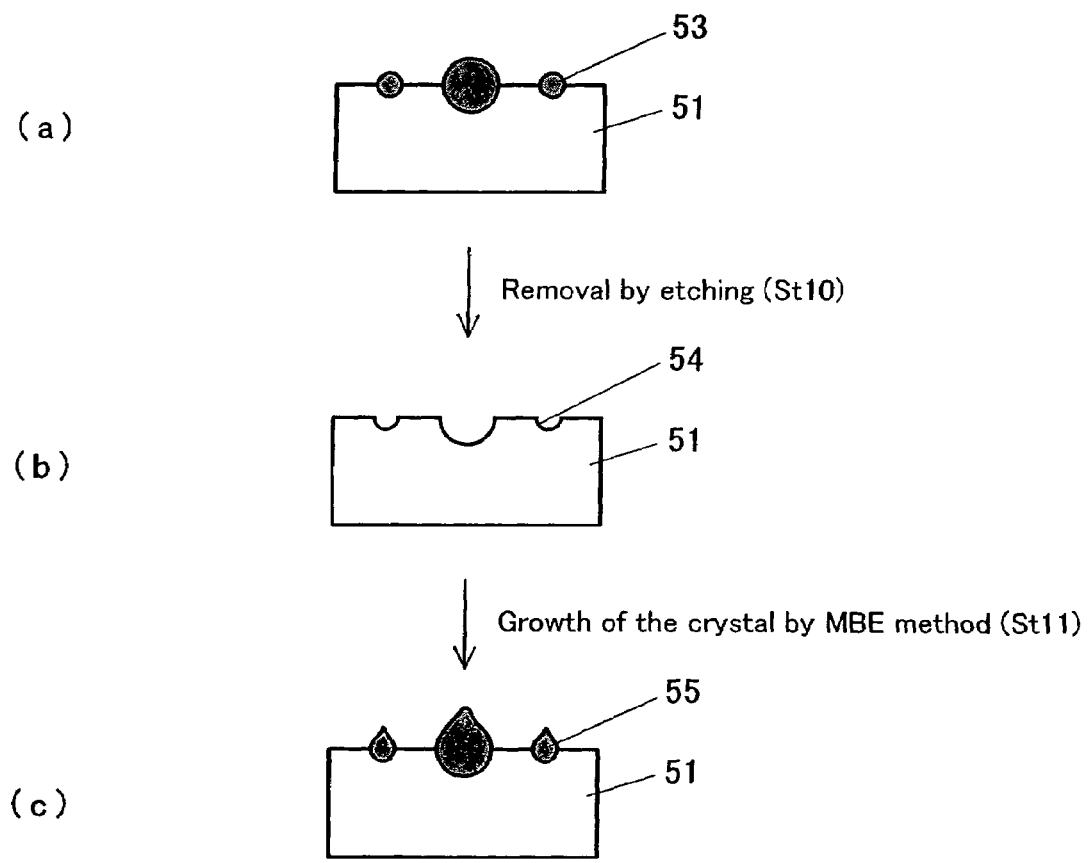
FIG. 22 is a cross sectional view illustrating steps following FIG. 21.

Hereinafter, the method of the production of the nanoparticle dispersed composite material according to this embodiment is explained with reference to drawings. FIG. 20 is a block diagram illustrating the method of the production of the nanoparticle dispersed composite material of this embodiment. As is shown in FIG. 20, the method of the production of the nanoparticle dispersed composite material of this embodiment includes a step of arranging a plurality of core fine particle-protein complexes having a core fine particle, which comprises an inorganic material, internally included within a protein on the top surface of a substrate (St1), a step of removing the protein (St2), a step of conducting ion implantation from the top surface of the substrate (St3), and a step of forming nanoparticles including the ion implanted by the ion implantation as a raw material, inside of the substrate (St4).

Figure 1:
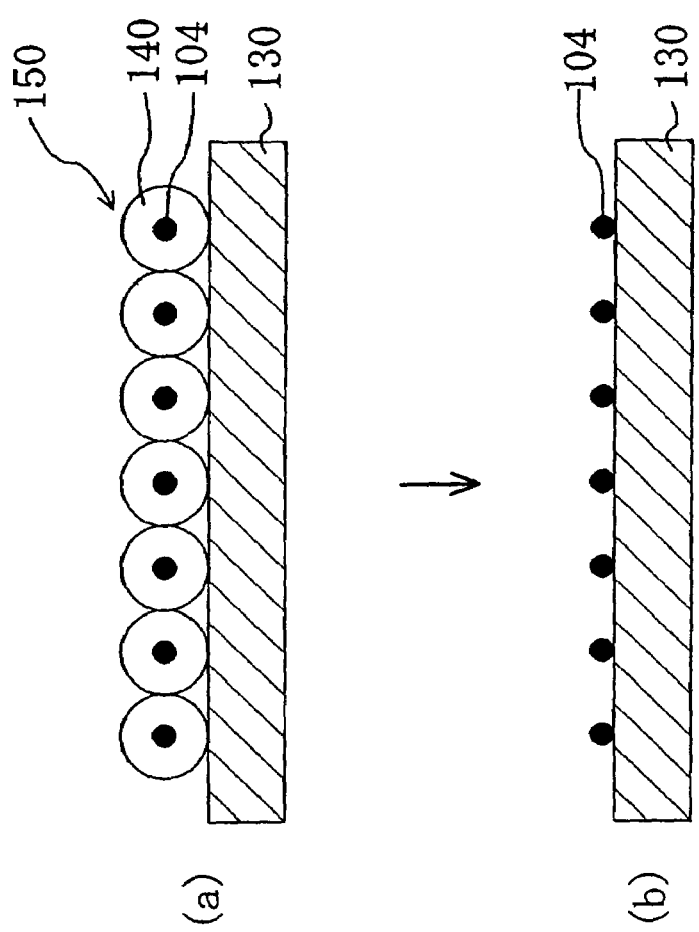
FIG. 1 is a cross sectional view schematically illustrating the first step according to this embodiment.

FIG. 1 is a cross sectional view schematically illustrating the St 1 and St 2 according to this embodiment. First, as shown in FIG. 1 (a), core fine particle-protein complexes (hereinafter, also may be merely referred to as complex) 150 are arranged on the top surface of a base board 130 (step (a)). Next, core fine particle 104 are arranged on the top surface of the base board 130 by removing the protein 140 constituting the complex 150 to leave only the core fine particle 104 (step (b)), as shown in FIG. 1 (b).

Figure 2:
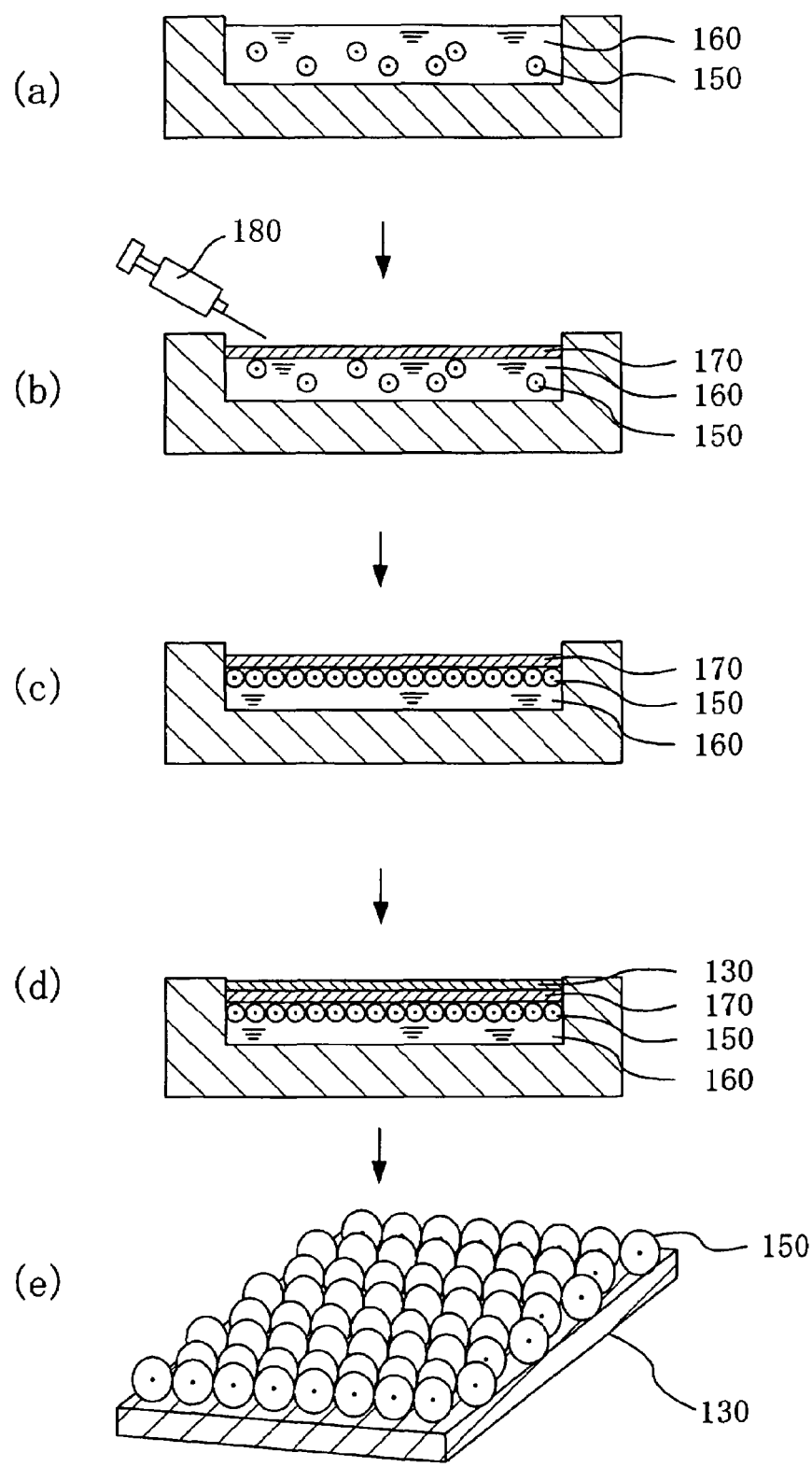
FIG. 2 is a cross sectional view and a top perspective view schematically illustrating the step depicted in FIG. 1 (a).

Specific process of the steps depicted in FIG. 1 (a) is explained now with reference to FIG. 2. FIG. 2 includes cross sectional views ((a) to (d)) and a top perspective view ((e)) schematically illustrating the process for arranging the complexes 150 on the surface of the base board 130. First, as shown in FIG. 2 (a), a liquid 160 including complexes 150 dispersed therein is provided. In this embodiment, a liquid including the complexes 150 dispersed in a mixed liquid (pH 5.8) of a 20 mM NaCl solution and a 20 mM MES buffered solution is used as the liquid 160. MES means 2-morpholinoethanesulfonic acid.

Subsequently, as is shown in FIG. 2 (b), PBLH (Poly-1-Benzil-L-Histidine) is gently developed on the surface of the liquid 160 with a syringe 180 or the like. Polypeptide membrane 170 which is composed of PBLH is thereby formed on the surface of the liquid 160. Thereafter, the pH of the liquid 160 is adjusted.

In a time dependent manner, the complexes 150 are adhered on the polypeptide membrane 170 as shown in FIG. 2 (c). This is caused by the positively charged polypeptide membrane 170, contrary to the negatively charged complexes 150.

Next, as is shown in FIG. 2 (d), adhesion of the polypeptide membrane 170 to the base board 130 is rendered by placing (floating) the base board 130 on the polypeptide membrane 170.

Next, by recovering the base board 130 as is shown in FIG. 2 (e), the base board 130 with the complexes 150 adhered in a two dimensional fashion via the polypeptide membrane 170 can be obtained.

Next, the step depicted in FIG. 1 (b) is explained in more detail. Because a protein is generally weak against heat, removal of the protein 140 in the complex 150 is carried out by a thermal treatment. For example, by standing still in an inert gas such as nitrogen or the like at 400–500° C. for about 1 hour, the protein 140 and the polypeptide membrane 170 are burnt out, and thus core fine particles 104 are regularly arranged on the base board 130 in a two dimensional fashion at a high density and with high accuracy.

The process for arranging the complexes 150 on the base board is not limited to the process as explained above, but any other known process can be also applied.

Figure 3:
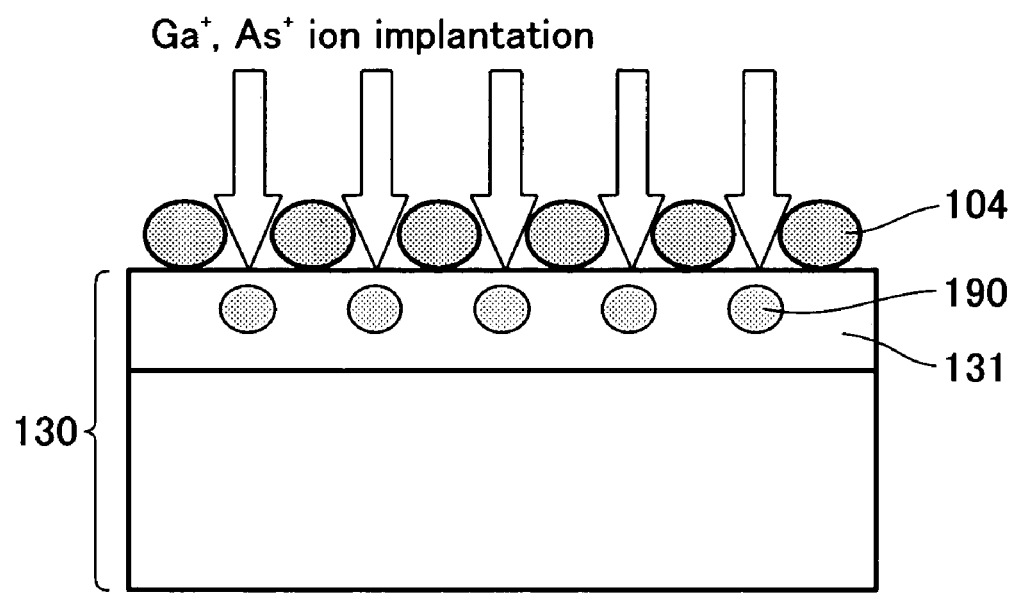
FIG. 3 is a cross sectional view schematically illustrating a step of ion implantation according to this embodiment.

FIG. 3 is a cross sectional view schematically illustrating a step following the steps depicted in FIG. 1. As is shown in FIG. 3, ion implantation is conducted from the top surface of the base board 130 having the core fine particles 104 arranged on the top surface thereof (step (c)), followed by a thermal treatment of the base board 130. The thermal treatment results in formation of nanoparticles 190 including the ion implanted by the aforementioned ion implantation as a raw material, inside of the aforementioned base board 130 (step (d)). Accordingly, a nanoparticle dispersed composite material is formed. In FIG. 3, an instance is shown in which a $Ga^+$ ion and an $As^+$ ion are implanted from the top surface of an Si base board 130 of which uppermost layer being an $SiO_2$ layer 131 to form the nanoparticles 190 comprising GaAs crystals within the $SiO_2$ layer 131.

The ion implantation refers to a technique in which an atom or a molecule is ionized, accelerated at several kV to several MV ($10^6$ V) to execute addition by throwing onto a sample surface of. When the ion implantation is conducted, the ion is implanted inside of the base board in the vicinity of the surface of the base board, whereby forming particles including the implanted ion as a raw material by a thermal treatment.

In the ion implantation, depth for formation of the nanoparticles 190 can be controlled by the accelerating voltage of the implanted ion. In addition, according to this embodiment, the core fine particles 104 are arranged on the face of the ion implantation, therefore, the two dimensional distribution of the nanoparticles 190 formed by such an arrangement can be controlled. Prospection of the grounds therefor is described in Example 3 below. Moreover, particle diameter of the nanoparticles 190 can be controlled by the dose amount upon the ion implantation, and the particle size and arrangement of the core fine particles 104. Alternatively, interaction may vary depending on the type of the ion and base board, therefore, the particle diameter of the nanoparticles 190 can be also controlled through utilizing such difference in interaction. Therefore, according to the method of this embodiment, the three dimensional distribution and particle diameter of the nanoparticles 190 in the nanoparticle dispersed composite material can be controlled. In this embodiment, any one of known ion implantation apparatuses may be used for the ion implantation.

Figure 4:
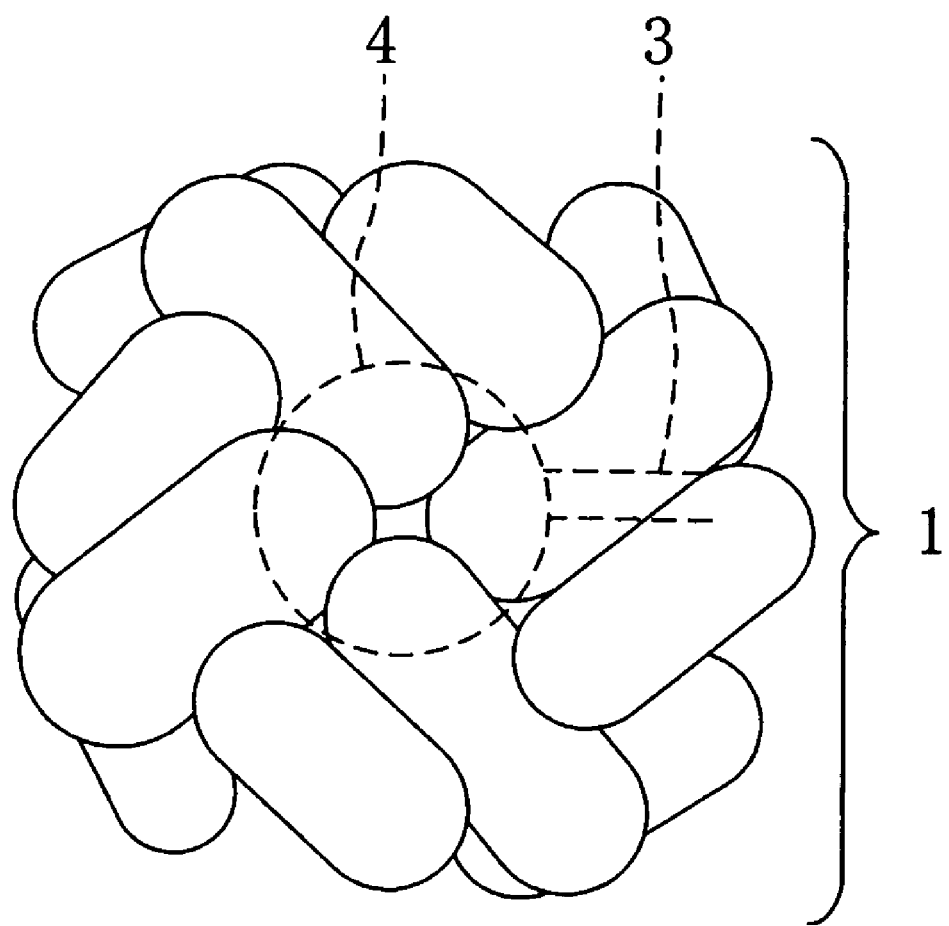
FIG. 4 is a schematic view illustrating the structure of apoferritin.

In this embodiment, ferritin is used as the core fine particle-protein complex 150. Ferritin is a complex of a core fine particle comprising iron or an iron compound, and apoferritin. FIG. 4 is a schematic view illustrating the structure of apoferritin. As is shown in FIG. 4, apoferritin 1 is a spherical protein having a molecular weight of about 460,000 with 24 monomer subunits, which are formed from a single polypeptide chain, being assembled via noncovalent bonds, and the diameter of the molecule is about 12 nm. There is a cavity-like holding part 4 having a diameter of about 7 nm at the center of apoferritin 1, and the outside and the holding part 4 are connected via a channel 3. For example, when a bivalent iron ion is incorporated into apoferritin 1, the iron ion enters from the channel 3, and reaches to the holding part 4 after being oxidized in a place which is present within a part of the subunits and is referred to as a ferrooxidase center (iron oxidation active center). The iron ion is thereafter concentrated at a negatively charged region on the inner surface of the holding part 4. Then, the iron atoms assemble by the number of 3000 to 4000, and are held in the holding part 4 in the form of a ferrihalide ($5Fe_2O_3 \cdot 9H_2O$) crystal. Diameter of the core fine particle being held in the holding part 4 and comprising the metal atom is nearly equal to the diameter of the holding part 4, which is about 7 nm. The core fine particle formed within the holding part 4 of apoferritin 1 is not perfectly spherical having a distorted shape to some extent. The particle size falls within the range of about 6 to 7 nm depending on the site of the measurement.

According to this embodiment, ferritin is used as the complex, therefore, the core fine particles 104 having a diameter of about 7 nm are aligned on the top surface of the base board 130 such that the center-to-center dimension becomes about 12 nm by the aforementioned step.

According to this embodiment, apoferritin has been used as the protein, however, core fine particles having a particle size of 4 nm can be manufactured when Dps protein (a protein in the shape of a spherical shell having a diameter of 9 nm, and having a holding part with a diameter of 4 nm inside thereof) is used in stead of apoferritin. Therefore, the core fine particles having a diameter of 4 nm can be arranged on the base board. Moreover, use of a viral protein such as CCMV, TMV and the like, or Listeria ferritin in stead of apoferritin can also lead to manufacture of the core fine particle commensurate with the shape of the holding part carried by each protein inside thereof, and thus manufactured core fine particles can be arranged on the base board. The shape of the holding part of a protein is not limited, but for example, a cylindrical protein such as tobacco mosaic virus may also be used. Further, the core fine particle internally included within the protein is not particularly limited as long as it comprises an inorganic material.

It is desired that the core fine particles having an approximately identical value of the diameter within the range of 2 nm or greater and 50 nm or less are regularly arranged with the center-to-center dimension thereof falling within the range of 4 nm or greater and 70 nm or less. According to this arrangement, it is desired that core fine particles having an approximately identical value of the diameter within the range of 2 nm or greater and 50 nm or less are regularly arranged with the center-to-center dimension thereof falling within the range of 4 nm or greater and 70 nm or less. This arrangement enables the production of the nanoparticle dispersed composite material with nanoparticles having a diameter of 2 nm or greater and 50 nm or less, with the center-to-center dimension thereof falling within the range of 4 nm or greater and 70 nm or less. Such a nanoparticle dispersed composite material can be utilized for a variety of usage on behalf of the quantum effect thereof.

Additionally, according to this embodiment, use of an ion of an atom such as Si, Ge or the like for the ion implantation enables the formation of a semiconductor nanoparticle, while use of an ion of an atom such as Ga, As, Cd, S, Zn, Se or the like enables the formation of a compound semiconductor nanoparticle such as GaAs, CdS, CdSe, ZnS or the like, and use of an ion of a metal atom such as Cu, W, Sn, Au or the like enables the formation of a metal nanoparticle.

EXAMPLE 1

This Example corresponds to the aforementioned embodiment, and relates to the method of the production of a nanoparticle dispersed composite material having a plurality of GaAs nanoparticles 190 formed in an $SiO_2$ layer 131 that is formed on the surface of an Si base board 130.

First, an Si base board 130 having an $SiO_2$ layer 131 on the surface thereof was provided. Thickness of the $SiO_2$ layer 131 of such an Si base board was 100 nm. The thickness of the $SiO_2$ layer 131 is not particularly limited as long as nanoparticles 190 can be formed inside thereof, and for example, an Si base board 130 having a thickness of 10 nm or greater and 100 nm or less can be used.

Ferritin 150 was arranged in a two dimensional fashion on the surface of the $SiO_2$ layer 131 of the aforementioned Si base board 130.

(Purification of Apoferritin)

From equine spleen ferritin (Sigma) was purified the 24-mer alone. Specifically, dialysis was performed using 0.5 mM EDTA, 10 mM Tris (pH 8.5) at 4° C. overnight. Thereafter, using a G4000SWXL PEEK column (TOSOH) which had been sufficiently equilibrated with 10 mM Tris HCl (pH 8.5) and 150 mM NaCl, only the 24-mer was collected by fractionation. Ferritin was further dialyzed using 1 wt % thioglycolic acid, 0.1M acetate buffer (pH 5.6) at 4° C. for 3 hrs, and then dialyzed using 0.1 M acetate buffer (pH 5.6) at 4° C. for 4 hrs to change into apoferritin, followed by dialysis against 50 mM Tris HCl (pH 8.5). Eventually, a solution of apoferritin dissolved in 150 mM NaCl was obtained.

(Internal Inclusion of Iron Ion)

To a solution of 100 μM iron sulfate was added a solution of apoferritin dissolved to give the final concentration of 0.1 μM. After adjusting the pH of the solution of 7.0 to 7.5 and allowing for a reaction at room temperature for 60 min, the product was recovered by centrifugation. Accordingly, a solution containing iron-apoferritin complexes 150 having core fine particles 104 comprising iron within the cavity part inside thereof was obtained.

The iron core fine particles 104 within the complex 150 had a diameter of approximately 7 nm, with the external diameter of the complex being approximately 12 nm.

(Alignment and Fixation on the Surface of the Base Board)

According to the procedure explained in the aforementioned embodiment, core fine particles 104 were fixed on the surface of the $SiO_2$ layer 131 of the Si base board 130. First, according to the procedure depicted in FIG. 2, the aforementioned complexes 150 were fixed on the base board 130, and thereafter, it was left to stand in a nitrogen gas atmosphere at a temperature of 400 to 500° C. for about 1 hour. Accordingly, apoferritin 140 thus disappeared, as is shown in FIG. 1 (b), to leave the internal iron particles 104 on the $SiO_2$ layer 131. Thus, a plurality of iron particles 104 were formed on the $SiO_2$ layer 131. Since the procedure shown in FIG. 1 and FIG. 2 was explained in detail in the aforementioned embodiment, detailed description is now omitted.

(Ion Implantation)

Next, as is shown in FIG. 3, ion implantation was conducted against the $SiO_2$ layer 131 under the condition of the accelerating voltage being 10 to 80 kV, more preferably 10 to 50 kV, with the dose amount of $Ga^+$ being $1 \times 10^{15}$ to $1 \times 10^{16}/cm^2$, and the dose amount of $As^+$ being $1 \times 10^{15}$ to $1 \times 10^{16}/cm^2$.

(Annealing)

Next, in an atmosphere of vacuum (or in an Ar gas atmosphere containing several % $H_2$), annealing was performed by placing the Si base board 130 in an electric furnace at an annealing temperature of 900° C. (acceptable as long as it is 800° C. or greater and 1000° C. or less), and the treatment time period of 60 min (acceptable as long as it is 30 min or greater and 60 min or less).

Accordingly, nanoparticles 190 comprising GaAs crystals were formed within the SiO$_2$ layer 131, thereby yielding a nanoparticle dispersed composite material.

EXAMPLE 2

In Example 2, a base board 130 having the uppermost layer comprising an Al$_2$O$_3$ layer 131 was provided. Use of a base board having a layer 131 formed with α-Al$_2$O$_3$ single crystals instead of the Al$_2$O$_3$ layer 131 also allows for the manufacture of a nanoparticle dispersed composite material, similarly to this Example.

First, similarly to Example 1, a plurality of core fine particles 104 were formed on the Al$_2$O$_3$ layer 131.

Next, as is shown in FIG. 3, ion implantation was conducted against the Al$_2$O$_3$ layer 131 under the condition of the accelerating voltage for Cd$^+$ being 20 to 600 kV, the accelerating voltage for S$^+$ being 10 to 200 kV, and with the dose amount of Cd$^+$ being $1\times10^{15}$ to $1\times10^{16}$/cm$^2$ and the dose amount of As$^+$ being $1\times10^{15}$ to $1\times10^{16}$/cm$^2$. In connection with the accelerating voltage, it is desired that the accelerating voltage for Cd$^+$ is set to be about 2.0 to 3.0 times, or 2.5 to 3.0 times higher compared to the accelerating voltage for S$^+$. The grounds therefor are set forth in Example 3.

Next, in an atmosphere of Ar+4% H$_2$ gas, annealing was performed by placing the base board in an electric furnace at an annealing temperature of 900° C. (acceptable as long as it is 800° C. or greater and 1000° C. or less), and the treatment time period of 60 min (acceptable as long as it is 30 min or greater and 90 min or less).

Accordingly, nanoparticles 190 comprising Cds crystals were formed within the Al$_2$O$_3$ layer 131, thereby yielding a nanoparticle dispersed composite material.

EXAMPLE 3

In this Example, profile calculation of ion implantation by the method described in the aforementioned embodiment was carried out. For the calculation, scattering calculation by a Monte Carlo method was used.

Figure 5:
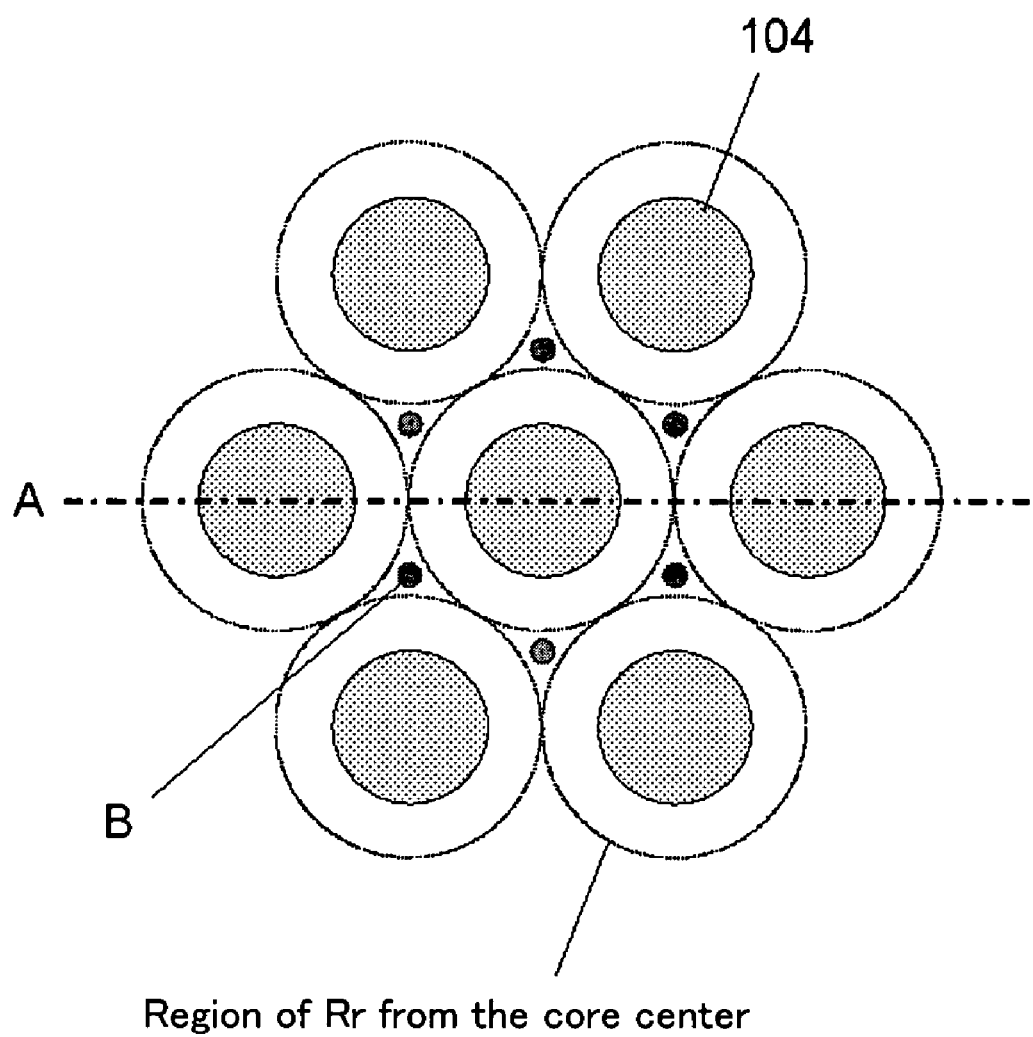
FIG. 5 is a top view illustrating the appearance of the arrangement of core fine particles according to Example 3.
Figure 6:
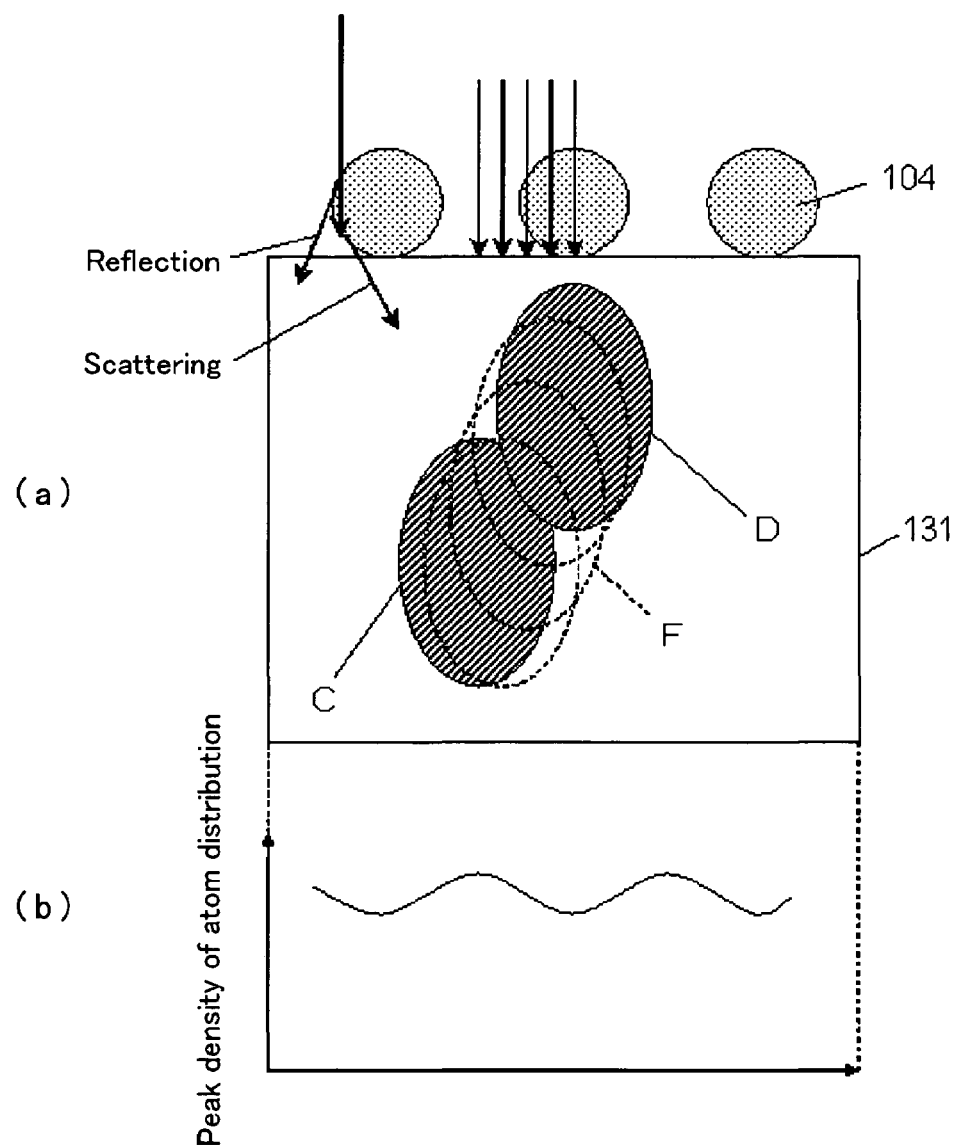
FIG. 6 is a cross sectional view illustrated along a cutting plane line A in FIG. 5.

In FIG. 5 and FIG. 6, a base board having core fine particles 104 arranged thereto, which is intended by this Example is illustrated. FIG. 5 is a top view illustrating the state of the arrangement of the core fine particles on the base board. FIG. 6 shows a cross sectional view (a) illustrated along a cutting plane line A in FIG. 5, and the shape of a graph of the peak density (b) of an atom distribution for the site of the cross section. In this Example, a base board is intended having an insulation layer 131, which comprises SiO$_2$, formed as the uppermost layer, with the top surface of the insulation layer 131 having core fine particles 104, of which diameter being 7 nm, arranged such that the center-to-center dimension between the core fine particles 104 becomes 12 nm. In FIG. 6, lower part of the base board than the insulation layer 131 is omitted. As is shown in FIG. 6, when ion implantation is conducted from the upside of the insulation layer 131 of the base board, the ions implanted directly into the insulation layer 131 at a region without the core fine particle 104 form the distribution C. On the other hand, the ions implanted to the central part of the core fine particles 104 form the distribution D.

Figure 7:
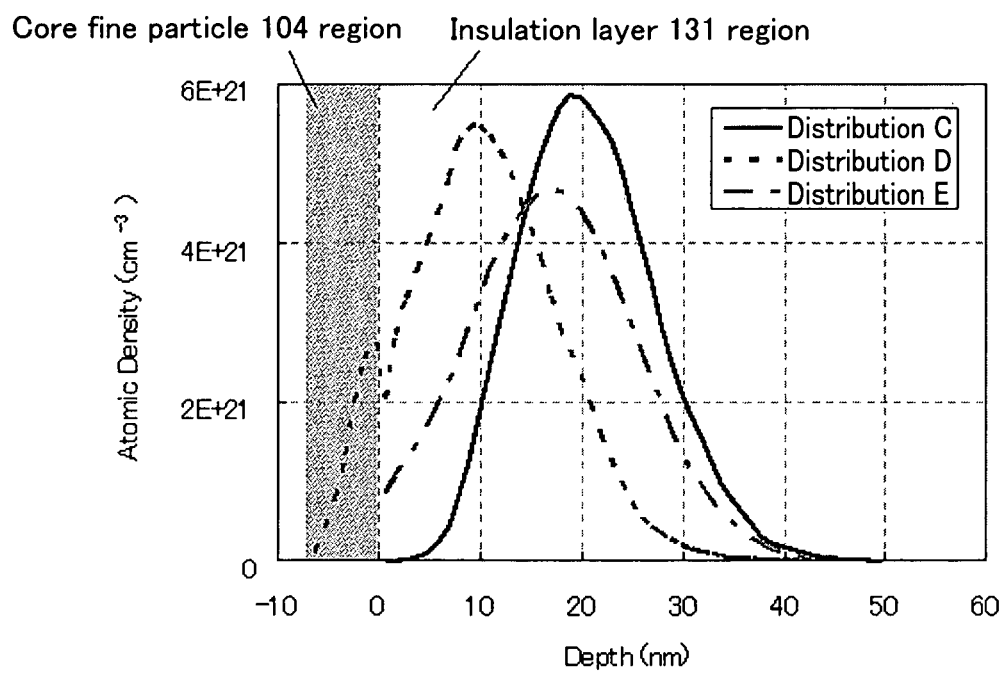
FIG. 7 is a view showing the results of calculation of distribution C, distribution D and distribution E when a $Ga^+$ ion was implanted at an accelerating voltage of 20 kV, and a dose amount of $1 \times 10^{16}/cm^2$.

FIG. 7 shows the results of calculation of the distribution C and distribution D when a Ga$^+$ ion was implanted into the insulation layer 131 at an accelerating voltage of 20 kV and a dose amount of $1\times10^{16}$/cm$^2$. In either one, the mean range of the ion in the lateral direction (Rr=$\Sigma$i(yi$^2$+zi$^2$)$^{1/2}$/N, wherein yi, zi represents a coordinate in the lateral direction viewed from the implantation point of the "i"th atom, and N represents total number of the atom) is 6 nm, and the mean range at the in-depth direction of the distribution C and distribution D (Rp=$\Sigma$i xi/N, wherein xi represents a coordinate in the in-depth direction of the "i"th atom) is 20 nm and 10 nm, respectively. For a reference, also in cases where implantation was conducted to the central part of the core fine particles 104, a part of the ions stop in the core fine particles 104, however, due to the small particle size of the core fine particle 104, many ions penetrate to reach to the insulation layer 131.

As a matter of fact, also in cases where the implantation is conducted via the core fine particles 104, the distance of passage of the ion through the core fine particle 104 may vary upon implantation at each position that is away from the center of the core fine particles 104. Therefore, as is shown by the dotted line in FIG. 6(a), an atom distribution is formed in each in-depth region between the distribution C and distribution D, depending on the distance of passage through the core fine particles 104. Further, because the implanted ions diffuse not only in the longitudinal direction but also in the lateral direction, the atomic concentration at each position in the insulation layer 131 becomes the summation of the atom distribution formed by the ions implanted to the adjacent region. In particular, influence of distribution of the implanted ion having the distance in the lateral direction viewed from each position of within the range of Rr (in this case, 6 nm) or less becomes great.

The radius of the core fine particle is then 3.5 nm, which is smaller than Rr, therefore, the distribution of the atomic concentration immediately below the core fine particle 104 is affected by not only the ion passing through the center of the core fine particle 104, but also the ion implanted to the adjacent region thereof or the region without the core fine particle 104. The atom distribution yielded by the overlap of these distributions becomes expanded through being averaged as is shown in distribution E in FIG. 7, and thus, the atomic concentration at the peak position becomes low in comparison with the original distribution. Similarly, also in the area without the core fine particle 104 viewed from above, influence of the distribution of the implanted ion via the core fine particles 104 becomes significant as the ion gets close to the core fine particles 104, leading to occurrence of expansion of the distribution and reduction of the peak density. Moreover, actually, upon implantation to the position away from the center of the core fine particles 104, oblique incidence, or scattering or reflection due to charge up may occur (see, FIG. 6(a)). Any of these operates, leading to expansion of the implantation profile.

As a consequence, the atom distribution profile inside of the insulation layer 131 is modulated to give a pattern correlating to the two dimensional sequence of the core fine particles 104. In other words, despite the event that total atomic number obtained by integration in an in-depth direction of each region is almost unchanged, the peak density thereof is modulated to be low below the core fine particles 104, while to be high in the region among the core fine particles 104, as shown in FIG. 6(b).

In FIG. 5, since every center of the core fine particle 104 is apart by 6 nm or greater at the position B, the atom distribution is approximate to the distribution C shown in FIG. 6(a), and thus, the peak density reaches to the maximum.

Subsequently, when an As$^+$ ion is implanted under the same condition to that for Ga$^+$ ion, a similarly modified atom distribution is obtained also for the As atom. Additionally, when a thermal treatment is carried out at 900° C. for 60 min, crystallization of GaAs is initiated in the region with high atomic concentration of Ga and As (position B in FIG. 5), followed by growing of the crystal through diffusion and absorption of surrounding implanted ions. Consequently, GaAs nanoparticles having a particle size of about 2 nm or greater and 10 nm or less are obtained.

According to the manufacture of nanoparticles by conventional ion implantation and thermal treatment, slight fluctuation of the atomic concentration within a base board is amplified by thermodynamic instability to initiate the core formation (phase separation). Therefore, position of the nanoparticles can not be controlled, and also, the variation of the size becomes great.

To the contrary, according to the present invention, core fine particles 104 can be regularly arranged in a two dimensional fashion on the surface of the base board 130 through using the complex 150 of a protein having a cavity part, and a core fine particle 104 internally included within the cavity part, such as ferritin or the like. Use of this core fine particle 104 enables modulation of the atom distribution of the atom previously in a two dimensional fashion, and allows for the core formation at a position having high a peak density (position B in FIG. 5). This effect is responsible for control of the two dimensional position of the produced nanoparticles. More regular alignment of the cores results in uniformity of the amount of atoms supplied during the growth of the nanoparticles, and is also effective in uniformity of the particle size of the produced nanoparticles.

Figure 8:
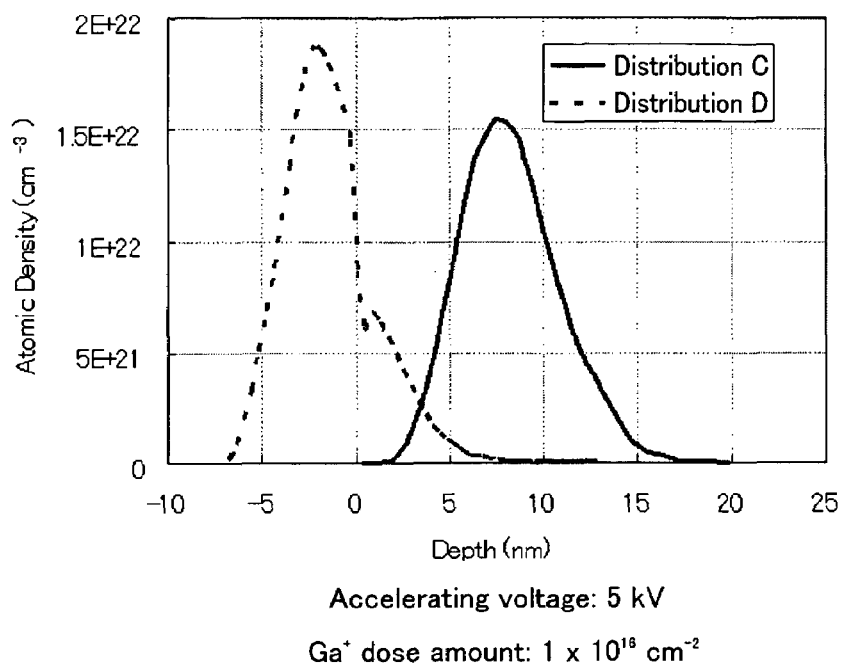
FIG. 8 is a view showing the results of calculation of distribution C and distribution D when a $Ga^+$ ion was implanted at an accelerating voltage of 5 kV, and a dose amount of $1 \times 10^{16}/cm^2$.
Figure 9:
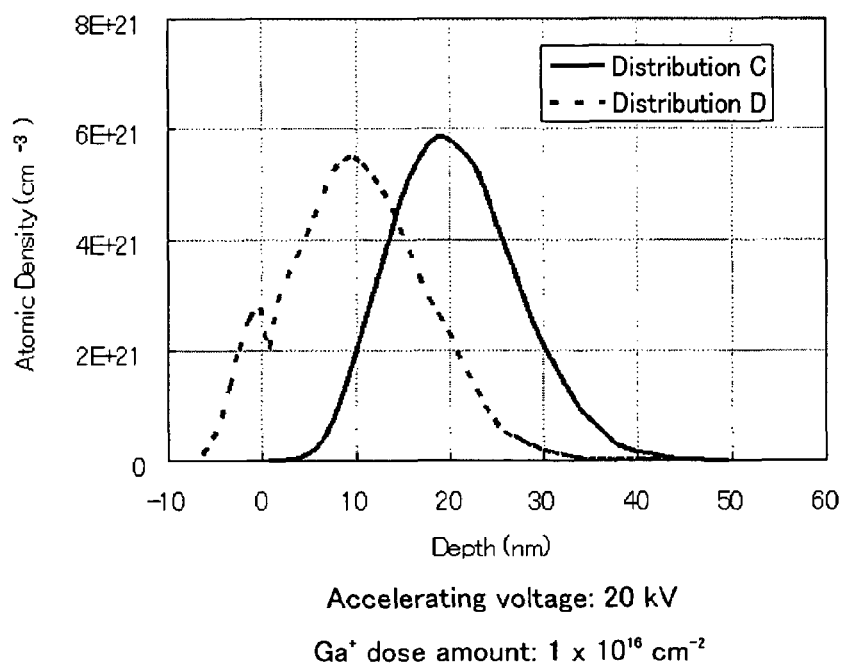
FIG. 9 is a view showing the results of calculation of distribution C and distribution D when a $Ga^+$ ion was implanted at an accelerating voltage of 20 kV, and a dose amount of $1 \times 10^{16}/Cm^2$.
Figure 10:
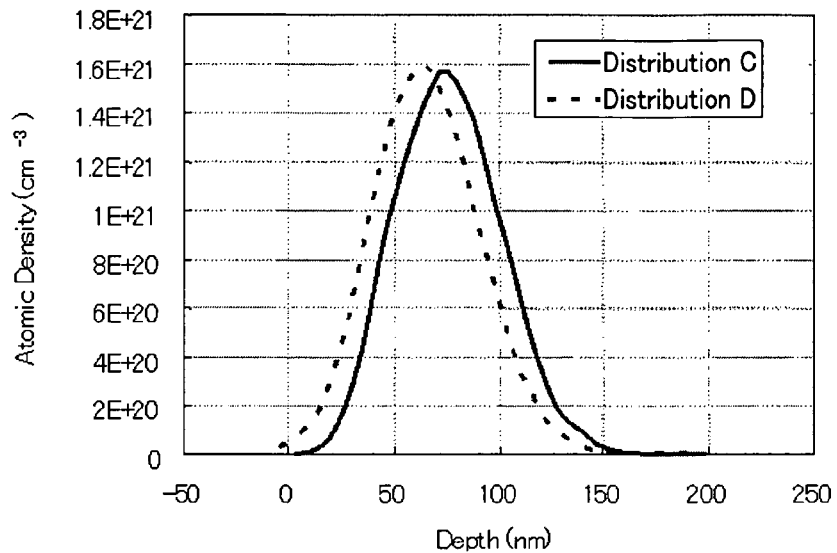
FIG. 10 is a view showing the results of calculation of distribution C and distribution D when a $Ga^+$ ion was implanted at an accelerating voltage of 100 kV, and a dose amount of $1 \times 10^{16}/cm^2$.

Additionally, by accelerating voltage applied upon the ion implantation, the depth of the produced nanoparticles can be controlled. FIG. 8 to FIG. 10 show the results of calculation of distribution C and distribution D when a $Ga^+$ ion was implanted with acceleration at 5 kV, 20 kV, 100 kV, respectively, at a dose amount of $1 \times 10^{16}/cm^2$. As is also clear from the results of calculation shown in FIG. 8 to FIG. 10, when the accelerating voltage applied upon the implantation of an ion is lowered, the depth of the nanoparticles 190 produced in the insulation layer 131 can be reduced. Further, when the accelerating voltage applied upon the implantation of an ion is lowered, lateral direction range is shortened, therefore, much sharper alteration of the peak density is enabled. Accordingly, nanoparticles 190 with a smaller diameter and a high density can be produced.

However, when the accelerating voltage is less than 5 kV, implantation efficiency may be reduced due to reevaporation or the surface charge, or removal of the core fine particles 104 on the surface may involve difficulties without damaging the particles 190 that were produced inside, following the thermal treatment.

Further, when the accelerating voltage is less than 10 kV, efficiency of recovery of the ion in the ion implantation apparatus is deteriorated, thereby involving difficulties in securing a sufficient dose amount for permitting deposition of the nanoparticles 190 inside of the insulation layer 131.

Therefore, the accelerating voltage is preferably 5 kV or greater, and more preferably 10 kV or greater.

Although the depth of the implantation for the accelerating voltage varies depending on the kind of the implanted ion as well as on the material of the base board for the implantation, the grounds as described above comply with any conditions. Therefore, the accelerating voltage is preferably 5 kV or greater, and more preferably 10 kV or greater irrespective of the kind of the ion and the material of the base board.

On the other hand, when the accelerating voltage employed upon the ion implantation is elevated, as is also clear from the results of calculation shown in FIG. 8 to FIG. 10, the depth of the nanoparticles 190 deposited in the insulation layer 131 can be increased. However, the range in a lateral direction range becomes so great, and the distribution in an in-depth direction upon the ion implantation becomes broad. For example, Rp of the distribution C and distribution D shown in FIG. 10 upon implantation of a $Ga^+$ ion accelerated at 100 kV is about 75 nm and about 64 nm, respectively. Because the original atom distribution is broad, less reduction of the peak density due to averaging among them is achieved. Further, although Rr for both of the distribution C and distribution D is 22 nm, this is great enough in comparison with the distance of 12 nm, which is a center-to-center dimension between the core fine particles 104. As a consequence, the influence by the core fine particles 104 on the surface of the insulation layer 131 is averaged inside of the insulation layer 131, leading to the reduction of the ratio of modulation of the peak density. Therefore, there exists a possibility that cores are not regularly formed at a position with a high peak density.

On the grounds as described above, it is desired that Rr of the implanted ion is at least two times or less of the center-to-center dimension of the core fine particles 104. In this range, expansion of the atom distribution in a longitudinal direction is also suppressed. The value of Rr can be calculated from the accelerating voltage when the atomic species of the implanted ion and the material of the insulation layer are revealed. As the method of the calculation, any kinds of simulation soft or published code can be utilized. For example, a relationship between an accelerating voltage and an atom distribution upon implantation of a $Ga^+$ ion into an $SiO_2$ layer is presented in Table 1, which was calculated through the use of a general Monte Carlo method.

TABLE 1

| | Accelerating voltage (kV): | | | | | |
|---|---|---|---|---|---|---|
| | 5 | 10 | 20 | 50 | 80 | 100 |
| Rp (nm): | 8 | 13 | 20 | 41 | 61 | 75 |
| Rr (nm): | 3 | 4 | 6 | 12 | 18 | 22 |

When core fine particles were arranged using equine ferritin having a diameter of 12 nm, the center-to-center dimension of the core fine particles becomes 12 nm. For the implantation of a $Ga^+$ ion into $SiO_2$, the range of the accelerating voltage is 50 kV or less for satisfying the aforementioned requirement that Rr of the implanted ion is at least the center-to-center dimension of the core fine particles 104. It is more preferred that Rr is ½ or less of the center-to-center dimension of the core fine particles 104 because a high peak density alteration can be achieved. In the aforementioned $Ga^+$ ion implantation, the range of the accelerating voltage which satisfies this requirement is 20 kV or less.

It is preferred that the dose amount of the implanted ion is within the range of $1 \times 10^{15}/cm^2$ or greater and $1 \times 10^{17}/cm^2$ or less, because deposition of nanoparticles having a particle size of about 2 nm or greater and 20 nm or less can be executed by the thermal treatment. Further, the dose amount within the range of $1 \times 10^{15}/cm^2$ or greater and $1 \times 10^{16}/cm^2$ or less permits the deposition of fine nanoparticles having a particle size of about 2 nm or greater and 10 nm or less, which is suited for application for a quantum effect device or the like.

Figure 11:
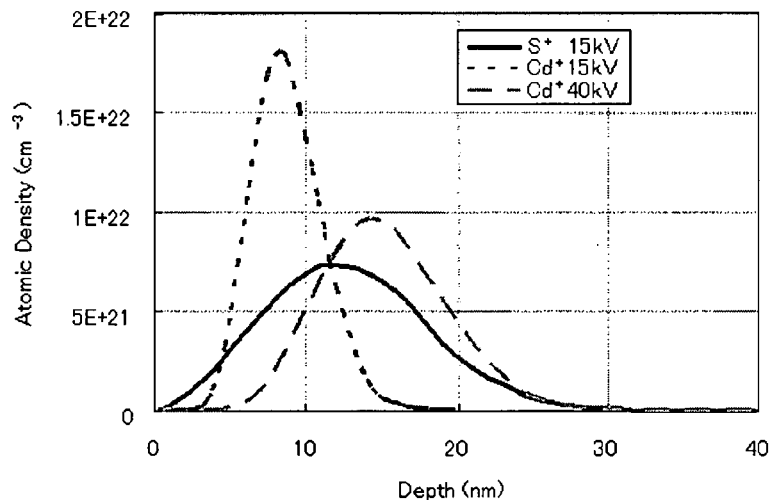
FIG. 11 is a view showing the results of calculation when an $S^+$ ion and a $Cd^+$ ion were implanted into an $Al_2O_3$ layer.

FIG. 11 shows the results of calculation of the distribution C when an $S^+$ ion was implanted into an $Al_2O_3$ layer at a dose amount of $1\times10^{16}/cm^2$ and an accelerating voltage of 15 kV; and the distribution C when a $Cd^+$ ion was implanted at a dose amount of $1\times10^{16}/cm^2$ and an accelerating voltage of 15 kV and 40 kV following the implantation of the $S^+$. The mass and the scattering cross section area of the $Cd^+$ ion are greater in comparison with those of the $S^+$ ion, therefore, the shape of the atom distribution greatly varies when the implantation is conducted at the same accelerating voltage. Accordingly, formation of the compound particle becomes difficult at a position controlled during the thermal treatment. Due to the different distribution in both instances, deposition or phase splitting as the elemental form may occur, or desired characteristics may not be achieved by way of the particle composition departing from the stoichiometric ratio. Although it is difficult to render the atom distribution completely identical, in this Example, the shape of the atom distribution can be greatly approximate by setting the accelerating voltage of $Cd^+$ to be about 2.7 times of the accelerating voltage of $S^+$. It is preferred that the accelerating voltage of $Cd^+$ is within the range of from about 2.0 times or greater to 3.0 times or less of the accelerating voltage of $S^+$.

Figure 12:
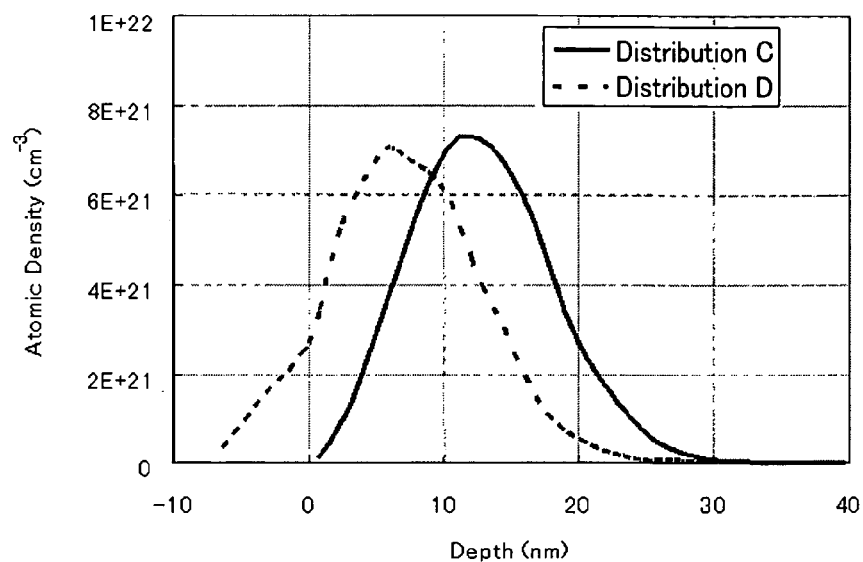
FIG. 12 is a view showing the results of calculation of distribution C and distribution D when an $S^+$ ion is implanted into an $Al_2O_3$ layer at a dose amount of $1 \times 10^{16}/cm^2$, and an accelerating voltage of 15 kV.
Figure 13:
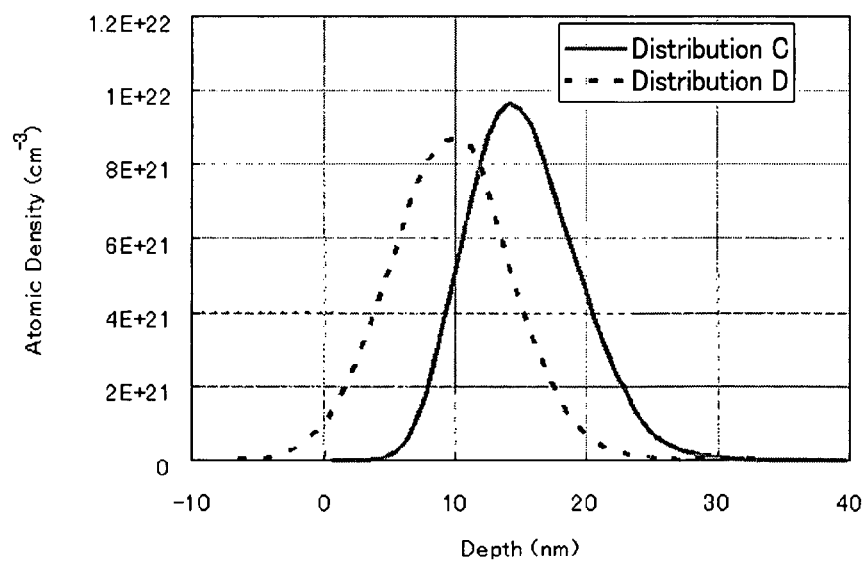
FIG. 13 is a view showing the results of calculation of distribution C and distribution D when a $Cd^+$ ion is implanted into an $Al_2O_3$ layer at a dose amount of $1 \times 10^{16}/cm^2$, and an accelerating voltage of 40 kV.

FIG. 12 shows the results of calculation of distribution C and distribution D when an $S^+$ ion is implanted into an $Al_2O_3$ layer at a dose amount of $1\times10^{16}/cm^2$ and an accelerating voltage of 15 kV. Further, FIG. 13 shows the results of calculation of distribution C and distribution D when a $Cd^+$ ion is implanted into an $Al_2O_3$ layer at a dose amount of $1\times10^{16}/cm^2$ and an accelerating voltage of 40 kV. As is clear from FIG. 11, FIG. 12 and FIG. 13, by setting the accelerating voltage of the $S^+$ ion being 15 kV, and the accelerating voltage of the $Cd^+$ ion being 40 kV, uniform depth of the peak of the atomic concentration can be provided, thereby capable of forming nanoparticles comprising CdS crystals in the following step.

Figure 14:
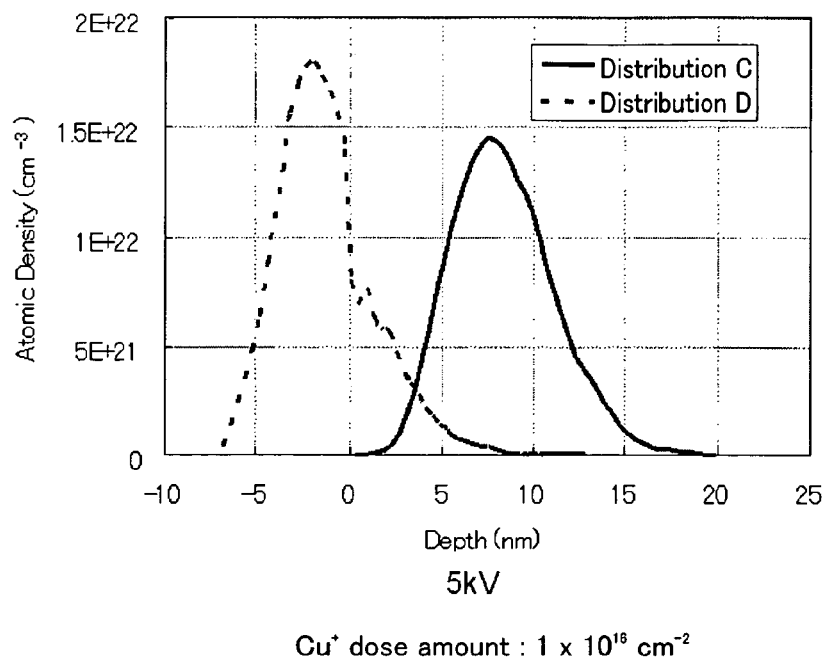
FIG. 14 is a view showing the results of calculation of distribution C and distribution D when a $Cu^+$ ion is implanted into an $SiO_2$ layer at a dose amount of $1 \times 10^{16}/cm^2$, and an accelerating voltage of 5 kV.
Figure 15:
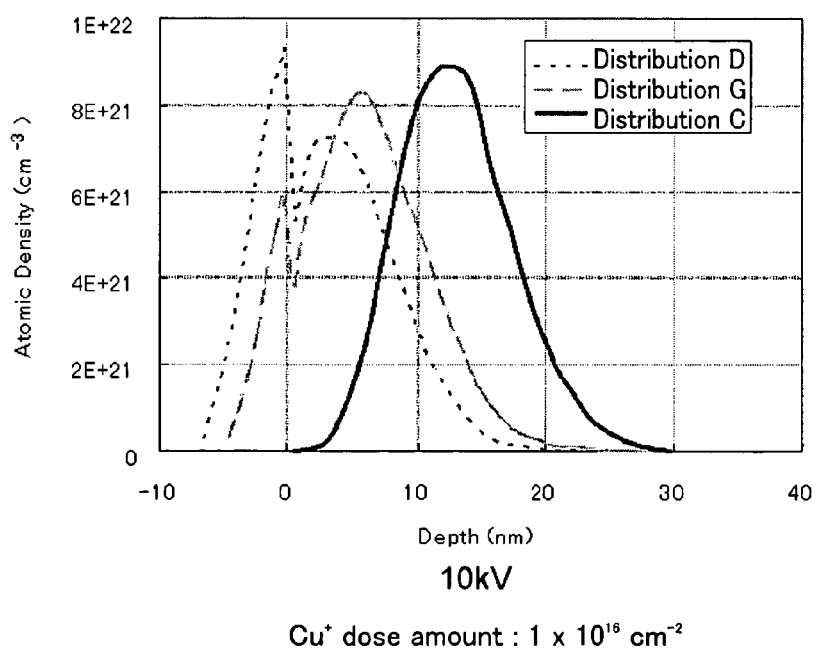
FIG. 15 is a view showing the results of calculation of distribution C, distribution D and distribution G when a $Cu^+$ ion is implanted into an $SiO_2$ layer at a dose amount of $1 \times 10^{16}/cm^2$, and an accelerating voltage of 10 kV.
Figure 16:
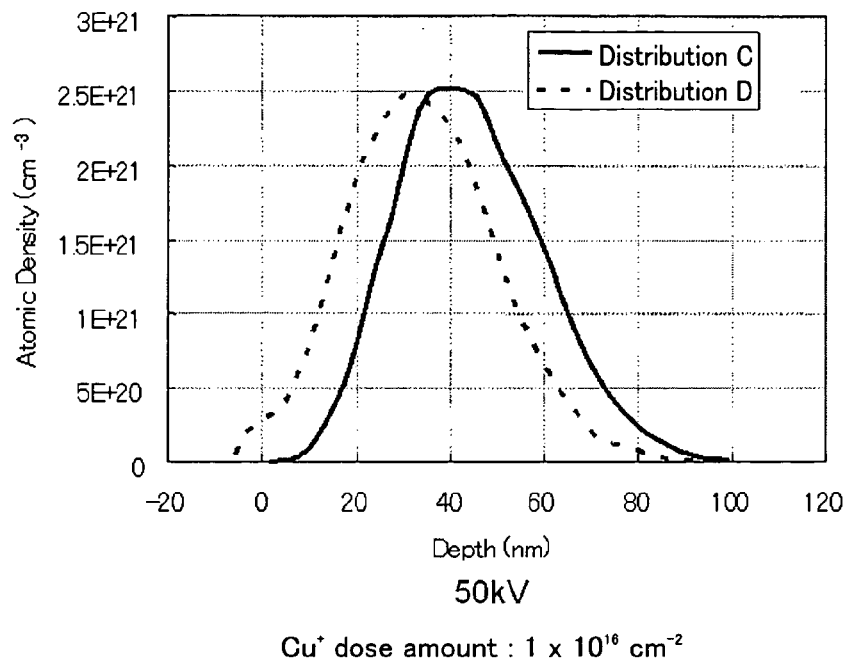
FIG. 16 is a view showing the results of calculation of distribution C and distribution D when a $Cu^+$ ion is implanted into an $SiO_2$ layer at a dose amount of $1 \times 10^{16}/cm^2$, and an accelerating voltage of 50 kV.

FIG. 14 to FIG. 16 show the results of calculation of distribution C and distribution D when a $Cu^+$ ion is implanted into an $SiO_2$ layer at a dose amount of $1\times10^{16}/cm^2$, and an accelerating voltage of 5 kV, 10 kV and 50 kV, respectively. The distribution D is a result of calculation of ions passing through the center of the core fine particles 104 having a diameter of 7 nm (i.e., travel distance of the core fine particle 104 is 7 nm). In FIG. 15, distribution of the ions with a travel distance of the core fine particles 104 being 5 nm is illustrated as a distribution G together with the distribution C and distribution D. On the grounds as described above, the accelerating voltage of the $Cu^+$ ion is preferably 5 kV or greater, and more preferably 10 kV or greater. Moreover, it is preferably 45 kV or less which results in Rr being equal to or less than the center-to-center dimension of the core fine particles 104, and still more, it is preferably 15 kV or less which results in Rr being equal to or less than ½ of the center-to-center dimension of the core fine particles.

(Discussion on Example 3)

Figure 17:
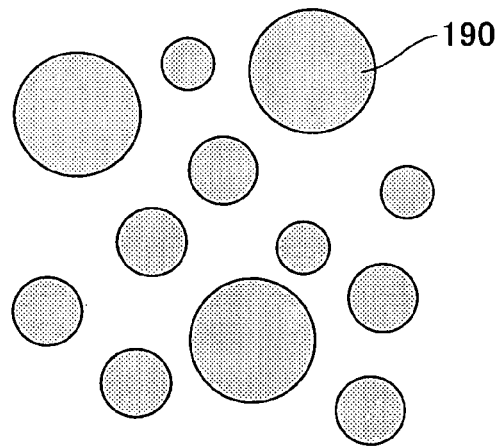
FIG. 17 is a view virtually illustrating the two dimensional distribution and shape of nanoparticles formed when core fine particles are not arranged on a base board.
Figure 18:
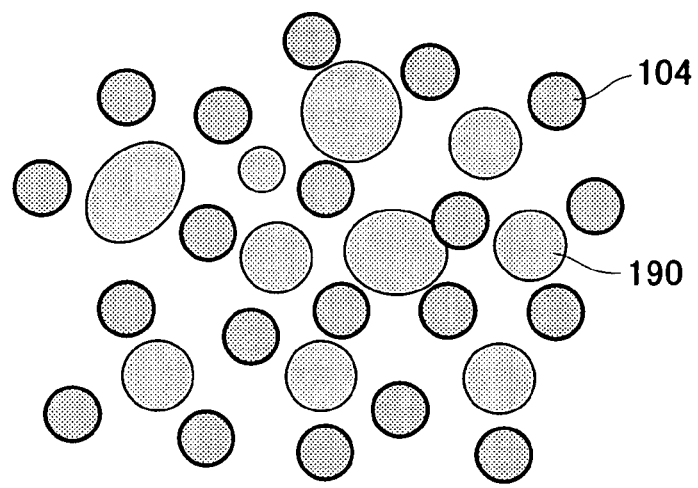
FIG. 18 is a view virtually illustrating the two dimensional distribution and shape of nanoparticles formed when core fine particles are amorphously arranged on a base board.
Figure 19:
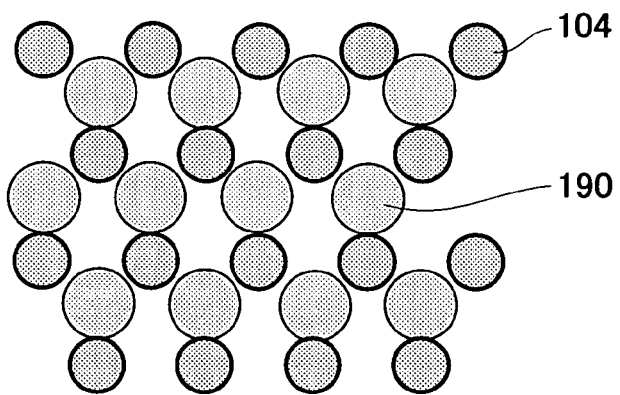
FIG. 19 is a view virtually illustrating the two dimensional distribution and shape of nanoparticles formed when core fine particles are regularly arranged on a base board.

On the basis of the results in Example 3, FIG. 17 to FIG. 19 virtually illustrate the two dimensional distribution and shape of nanoparticles formed, through the arrangement of the core fine particles on a base board. FIG. 17 shows the instance where no core fine particle 104 is present. In this instance, the two dimensional distribution and shape of the nanoparticles 190 shall have a great fluctuation. Because the two dimensional concentration distribution of the implanted ion is not controlled, it is expected that the great fluctuation may be generated. FIG. 18 shows the instance where the arrangement of the core fine particles 104 follows an amorphous arrangement lacking regularity. In this instance, although there exists fluctuation in the two dimensional distribution of the nanoparticles, fluctuation of the size of the nanoparticles is expected to be reduced in comparison with the instance as shown in FIG. 17. FIG. 19 shows the instance where the arrangement of the core fine particles 104 follows an arrangement with regularity. In this instance, the position where the two dimension of the nanoparticles 190 is formed can be controlled, therefore, it is believed that the two dimensional distribution and the size of the nanoparticles 190 shall be reduced. As described hereinabove, according to the present invention, two dimensional arrangement of the core fine particles 104 can be controlled by using the complex 150, therefore, the two dimensional distribution and the particle size of the formed nanoparticles can be controlled with high accuracy.

According to the method of the present invention, because three dimensional position of nanoparticles formed within a substrate can be controlled with high accuracy, a nanoparticle dispersed composite material having nanoparticles regularly formed can be provided. Also, the particle diameter of the nanoparticles can be controlled with high accuracy, and for example, it is also possible to form nanoparticles of 10 nm or less.

The nanoparticle dispersed composite material produced according to the present invention is useful as an information communication device such as quantum dot computers, quantum dot memories and the like. Moreover, it is also useful for applications to quantum dot lasers and identification bar codes in a living body.

From the description hereinabove, many improvements and other embodiments of the present invention will be apparent to persons skilled in the art. Therefore, the foregoing description should be construed as merely an illustrative example, which is provided for the purpose of teaching the best embodiment for carrying out the present invention to the persons skilled in the art. Details of the structure and/or function can be substantially altered without departing from the spirit of the present invention.

What is claimed is:

1. A method of the production of a nanoparticle dispersed composite material, said method comprising the steps of:
    a step (a) of arranging a plurality of core fine particle-protein complexes having a core fine particle, which comprises an inorganic material, internally included within a protein on the top surface of a substrate,
    a step (b) of removing said protein,
    a step (c) of conducting ion implantation from the top surface of said substrate, and
    a step (d) of forming nanoparticles including the ion implanted by said ion implantation as a raw material, inside of said substrate by a thermal treatment.

2. The method of the production of a nanoparticle dispersed composite material according to claim 1 wherein said protein is removed by a thermal treatment in said step (b).

3. The method of the production of a nanoparticle dispersed composite material according to claim 1 wherein said protein is apoferritin, and said core fine particle comprises iron.

4. The method of the production of a nanoparticle dispersed composite material according to claim 1 wherein said nanoparticle is any one of a semiconductor, a compound semiconductor, or a metal.

5. The method of the production of a nanoparticle dispersed composite material according to claim 1 wherein said nanoparticle is any one of GaAs, CdS, or Cu.

6. The method of the production of a nanoparticle dispersed composite material according to claim 1 wherein the ion implantation is conducted at an accelerating voltage of 5 kV or greater in said step (c).

7. The method of the production of a nanoparticle dispersed composite material according to claim 6 wherein the ion implantation is conducted at an accelerating voltage of 10 kV or greater in said step (c).

8. The method of the production of a nanoparticle dispersed composite material according to claim 1 wherein the mean range in the lateral direction of the implanted ion is equal to or less than the center-to-center dimension of said core fine particles in said step (c).

9. The method of the production of a nanoparticle dispersed composite material according to claim 8 wherein the mean range in the lateral direction of the implanted ion is equal to or less than ½ of the center-to-center dimension of said core fine particles in said step (c).

10. The method of the production of a nanoparticle dispersed composite material according to claim 1 wherein the core fine particles having an approximately identical value of the diameter within the range of 2 nm or greater and 50 nm or less are regularly arranged with the center-to-center dimension thereof falling within the range of 4 nm or greater and 70 nm or less in said step (b).

11. The method of the production of a nanoparticle dispersed composite material according to claim 1 wherein the layer of said substrate where said nanoparticles are formed comprises $SiO_2$ or $Al_2O_3$.

12. The method of the production of a nanoparticle dispersed composite material according to claim 1 wherein the dose amount of the implanted ion is within the range of $1\times10^{15}/cm^2$ or greater and $1\times10^{17}/cm^2$ or less in said step (c).

* * * * *